(12) United States Patent
Sakamaki

(10) Patent No.: US 11,749,777 B2
(45) Date of Patent: Sep. 5, 2023

(54) METHOD FOR MANUFACTURING LIGHT-EMITTING MODULE

(71) Applicant: NICHIA CORPORATION, Anan (JP)

(72) Inventor: So Sakamaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 534 days.

(21) Appl. No.: 16/859,039

(22) Filed: Apr. 27, 2020

(65) Prior Publication Data

US 2020/0343408 A1 Oct. 29, 2020

(30) Foreign Application Priority Data

Apr. 27, 2019 (JP) .................................. 2019-086910

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01); *H01L 2933/0058* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 9,543,484 B1 | 1/2017 | Endo et al. | |
| 9,705,041 B2* | 7/2017 | Im | H01L 33/382 |
| 2008/0173884 A1 | 7/2008 | Chitnis et al. | |
| 2008/0179611 A1 | 7/2008 | Chitnis et al. | |
| 2012/0097972 A1* | 4/2012 | Sugizaki | H01L 33/486 257/E33.068 |
| 2014/0319567 A1 | 10/2014 | Yoneda et al. | |
| 2015/0187995 A1 | 7/2015 | Yoneda et al. | |
| 2017/0077367 A1* | 3/2017 | Shimojuku | H01L 33/44 |
| 2017/0205565 A1 | 7/2017 | Akagawa et al. | |

(Continued)

FOREIGN PATENT DOCUMENTS

| | | |
|---|---|---|
| JP | 2006100444 A | 4/2006 |
| JP | 2010517289 A | 5/2010 |
| JP | 2014225644 A | 12/2014 |

(Continued)

*Primary Examiner* — Ratisha Mehta
(74) *Attorney, Agent, or Firm* — Hunton Andrews Kurth LLP

(57) ABSTRACT

A method for manufacturing a light-emitting module, includes placing a light-emitting element on a support member with an electrode formation surface of the light-emitting element facing upward; forming a pair of first conductive members respectively on the element electrodes; forming a first light-reflective resin layer on the support member and around the light-emitting element and the first conductive members; forming a pair of second conductive members on the first light-reflective resin layer and respectively on the first conductive members, the second conductive member being wider than the first conductive member; forming a second light-reflective resin layer on the first light-reflective resin layer and around the second conductive members; forming wiring electrodes over the second light-reflective resin layer from the second conductive members; and removing the support member.

18 Claims, 9 Drawing Sheets

(56) References Cited

U.S. PATENT DOCUMENTS

2018/0151547 A1    5/2018   Oka et al.
2018/0175255 A1    6/2018   Morikawa

FOREIGN PATENT DOCUMENTS

| JP | 2015043462 A | 3/2015 |
| --- | --- | --- |
| JP | 2015144263 A | 8/2015 |
| JP | 2016015356 A | 1/2016 |
| JP | 2016086047 A | 5/2016 |
| JP | 2016086111 A | 5/2016 |
| JP | 2017055037 A | 3/2017 |
| JP | 2017055038 A | 3/2017 |
| JP | 2017130497 A | 7/2017 |
| JP | 2018092984 A | 6/2018 |
| JP | 2018101753 A | 6/2018 |
| JP | 2019057627 A | 4/2019 |

\* cited by examiner

US 11,749,777 B2

METHOD FOR MANUFACTURING LIGHT-EMITTING MODULE

CROSS-REFERENCE TO RELATED APPLICATION

This application claims priority to Japanese Patent Application No. 2019-086910, filed on Apr. 27, 2019, the disclosure of which is hereby incorporated by reference in its entirety.

BACKGROUND

The disclosure relates to a method for manufacturing a light-emitting module.

A light-emitting device that uses a light-emitting element such as a light-emitting diode or the like is utilized widely as a backlight of a liquid crystal display, various light sources of displays, etc. Such a light-emitting device is utilized widely as various light sources of displays, etc. A structure has been proposed for such a light-emitting device in which light-emitting elements are placed on a substrate including wiring. For example, JP-A 2006-100444 (Kokai) discusses a light-emitting device in which wiring is included at the upper surface of a substrate; and electrodes at the lower surface of the light-emitting element are connected to the wiring.

SUMMARY

In recent years, it is desirable to further downsize light-emitting devices. To downsize light-emitting devices, high placement precision is necessary when forming the wiring.

The disclosure provides a method for manufacturing a light-emitting module in which downsizing is possible.

In an embodiment of the present disclosure, a method for manufacturing a light-emitting module includes placing a light-emitting element on a support member with an electrode formation surface of the light-emitting element facing upward, the electrode formation surface including a pair of positive and negative element electrodes at a same surface side, the light-emitting element having the electrode formation surface and a light-emitting surface at a side opposite to the electrode formation surface; forming a pair of first conductive members respectively on the element electrodes; forming a first light-reflective resin layer on the support member and around the light-emitting element and the first conductive members; forming a pair of second conductive members on the first light-reflective resin layer and respectively on the first conductive members, the second conductive member being wider than the first conductive member; forming a second light-reflective resin layer on the first light-reflective resin layer and around the second conductive members; forming wiring electrodes over the second light-reflective resin layer from the second conductive members; and removing the support member.

According to a method for manufacturing a light-emitting module according to the present disclosure, a light-emitting module with downsizing can be realized.

BRIEF DESCRIPTION OF THE DRAWINGS

FIG. 2 to FIG. 10A are schematic cross-sectional views showing a manufacturing process of the light-emitting module according to the embodiment;

DETAILED DESCRIPTION OF EMBODIMENTS

Figure 1:
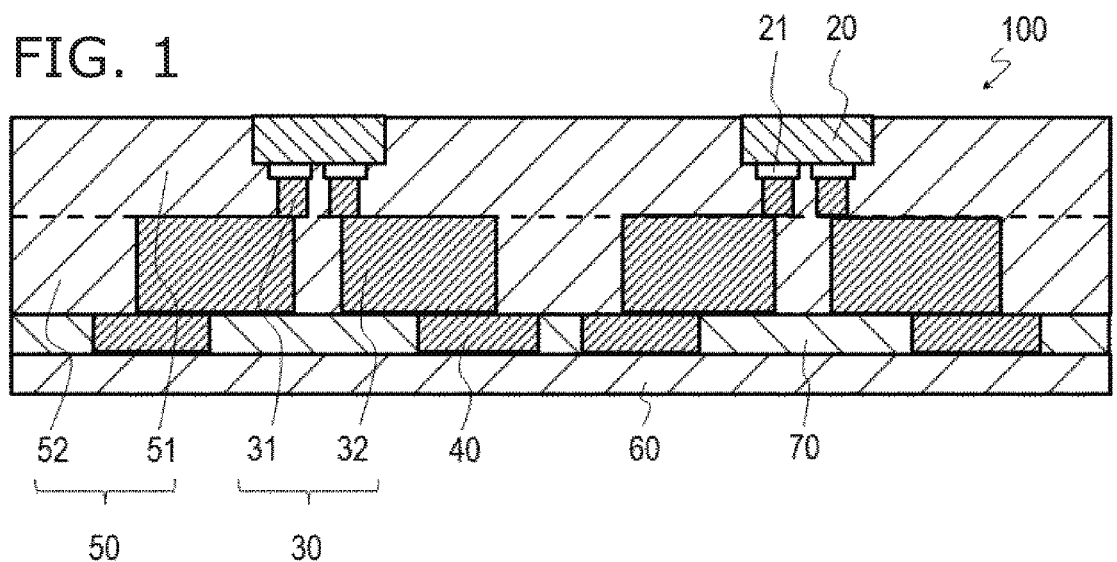
FIG. 1 is a schematic cross-sectional view of a light-emitting module according to an embodiment of the present disclosure.

Embodiments of the invention will now be described with reference to the drawings as appropriate. However, the forms described below are embodiments of the technical idea of the invention; and the invention is not limited to the following description unless specifically stated. The sizes, positional relationships, and the like of the members shown in the drawings may be exaggerated to clarify the description.

The invention will now be described in detail based on the drawings. Although terms (e.g., "up", "down", and other terms including such terms) are used to indicate designated directions and/or positions as necessary in the description hereinbelow, such terms are used for easier understanding of the invention with reference to the drawings; and the technical scope of the invention is not limited by the meaning of such terms. Portions that have like reference numerals in multiple drawings indicate the same or equivalent portions or members.

The embodiments described below illustrate a light-emitting module as a specific example of the technical idea of the invention and do not limit the invention to the following. Unless expressly specified, the dimensions, materials, configurations, relative arrangements, etc., of the component parts recited below are not intended to limit the scope of the invention and are intended as examples. The content described in one embodiment or example also is applicable to other embodiments and examples. The sizes, positional relationships, and the like of the members shown in the drawings may be exaggerated to clarify the description.

FIG. 1 is a schematic cross-sectional view of a light-emitting module obtained by a manufacturing method according to the embodiment.

The light-emitting module may include a substrate 60, a wiring electrode 40 provided at the upper surface of the substrate 60, a conductive member 30 provided at the upper surface of the wiring electrode, a light-reflective resin layer 50 provided around the conductive member 30, and a light-emitting element 20 placed on the upper surface of the conductive member 30.

The conductive member 30 may include a first conductive member 31 and a second conductive member 32. The second conductive member 32 is provided at the upper surface of the wiring electrode 40; and the first conductive member 31 is provided on the second conductive member 32.

The light-reflective resin layer 50 may include a first light-reflective resin layer 51 and a second light-reflective resin layer 52. The first light-reflective resin layer 51 is provided around the light-emitting element 20 and the first conductive member 31; and the second light-reflective resin layer 52 is provided around the second conductive member 32. The first light-reflective resin layer 51 and the second light-reflective resin layer 52 may be formed to have a continuous body.

The light-emitting element 20 has an electrode formation surface 20a including a pair of positive and negative element electrodes 21 at the same surface side, and a light-emitting surface at the side opposite to the electrode formation surface 20a. Flip chip mounting of the light-emitting element 20 is performed directly or via bumps, etc., so that the element electrodes 21 oppose the upper surfaces of the conductive members 30.

The light-emitting element 20 has the electrode formation surface 20a including the positive and negative element electrodes 21, and the light-emitting surface at the side opposite to the electrode formation surface 20a. Flip chip mounting of the light-emitting element 20 is performed directly or via bumps, etc., so that the element electrodes 21 oppose the upper surfaces of the conductive members 30.

The method for manufacturing the light-emitting module will now be described in detail based on the schematic cross-sectional views shown in FIGS. 2 to 25.

Process of Placing Light-Emitting Element 20

Figure 2:
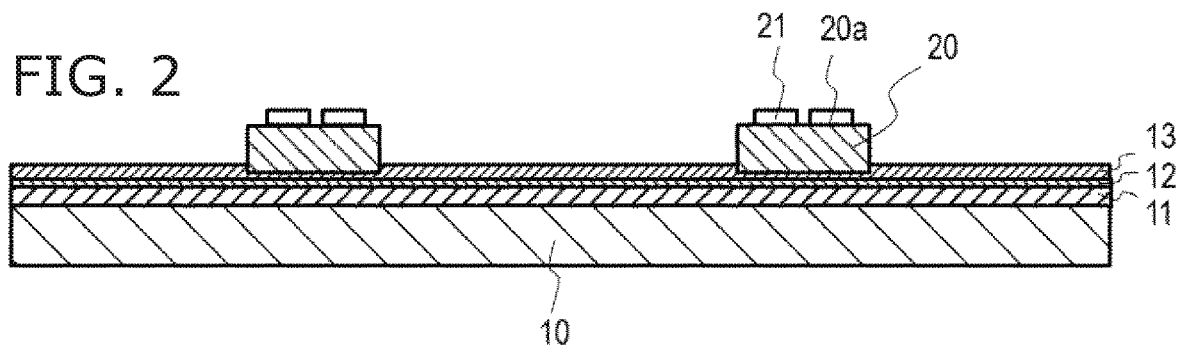

As shown in FIG. 2, the light-emitting element 20 is placed on a support member 10. The light-emitting element 20 is placed in a state in which the electrode formation surface 20a faces upward and the light-emitting surface faces downward. In the light-emitting module, multiple light-emitting elements 20 may be placed at a prescribed spacing. In such a case, the element electrodes 21 of the light-emitting elements 20 can be electrically connected to each other by the wiring electrode 40 in a process of forming the wiring electrode 40 described below.

The support member 10 is such that the light-emitting element 20 may be placed. Although the configuration of the support member 10 is not particularly limited, it is preferable for the upper surface of the support member 10 to be flat. The support member 10 and the light-emitting element 20 are bonded by a bonding layer 13. For example, an epoxy resin or the like can be used as the bonding layer 13.

A photosensitive resin layer is formed on the upper surface of the support member 10 as a release layer 11. The bonding layer 13 is formed on the upper surface of the release layer 11 with a protective layer 12 interposed. The release layer 11 can be used subsequently to separate the light-emitting element 20 from the support member 10 by irradiating light.

Figure 3:
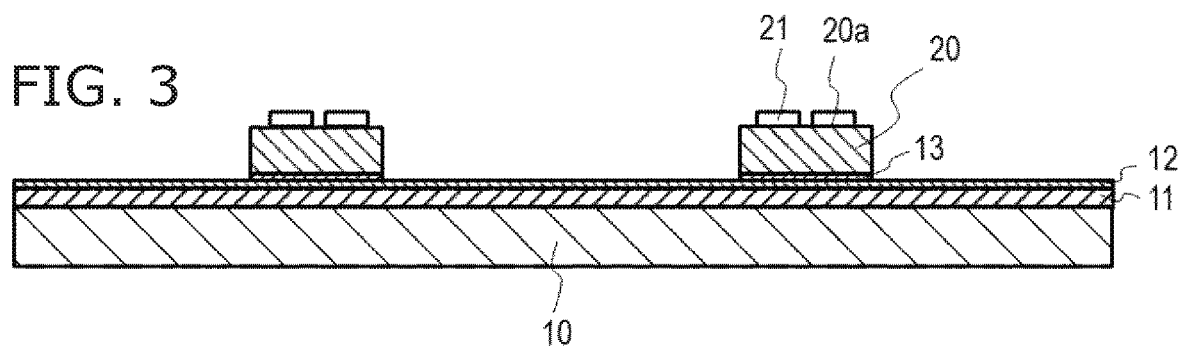
Figure 4:
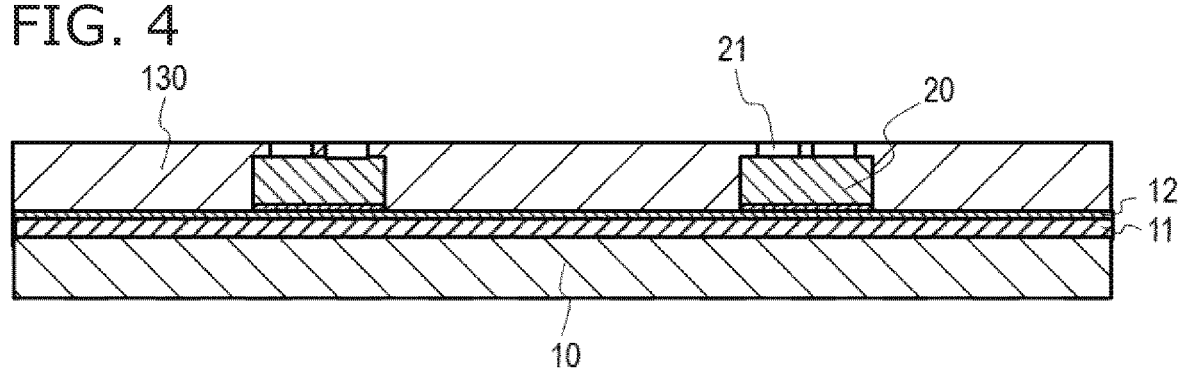

Then, as shown in FIG. 3, the bonding layer 13 that is in the region other than the placement region of the light-emitting element is removed by etching. The protective layer 12 performs the role of preventing etching of the release layer 11. It is preferable for a metal to be used as the material of the protective layer 12. Ti or the like can be used as the metal of the protective layer 12.

Process of Forming Covering Layer 130

Then, a covering layer 130 is formed on the support member and around the light-emitting element 20. The covering layer 130 may be provided by coating the material of the covering layer 130 on the support member. The coating method may be spin coating by a spin coater, dispensing by a dispenser, etc., and is not particularly limited. It is preferable for the covering layer 130 to include a member including an organic substance. Thereby, in a process of removing the covering layer 130 described below, the removal can be performed easily by etching. For example, polyimide or an epoxy resin can be used as the organic substance.

Figure 5:
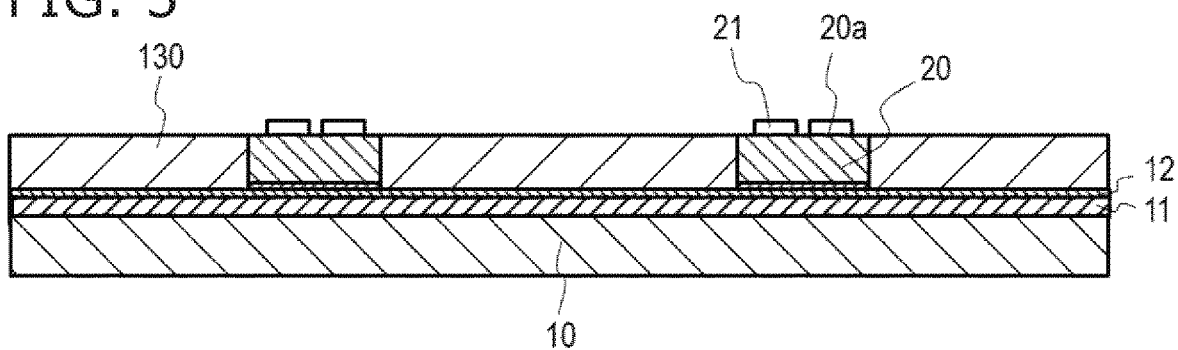

After providing the covering layer 130 to cover the support member 10 and the light-emitting element 20, a portion of the covering layer 130 is removed by etching until the element electrodes 21 of the light-emitting element 20 are exposed as shown in FIG. 5.

Process of Forming First Conductive Member 31

Then, a pair of first conductive members 31 is formed respectively on the element electrodes 21 for each light-emitting element 20. The first conductive member 31 is formed by stacking a first metal layer 31a and a second metal layer 31b.

Figure 6:
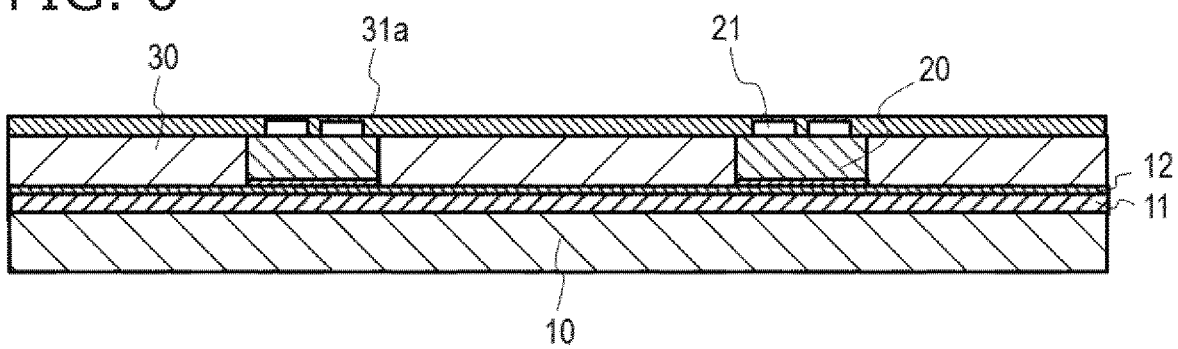

In the process of forming the first conductive member 31, first, the first metal layer 31a is formed on the element electrodes 21 of the light-emitting element. In FIG. 6, the first metal layer 31a is formed on substantially the entire surface of the light-emitting element 20 and the covering layer 130 by sputtering, etc. The first metal layer 31a is used as a seed layer when forming the second metal layer 31b by electroplating in a process of forming the second metal layer 31b which is a subsequent process. For example, Al/Ti/Cu or the like from the support member 10 side is an example of the stacked structure of the first metal layer 31a.

Figure 7:
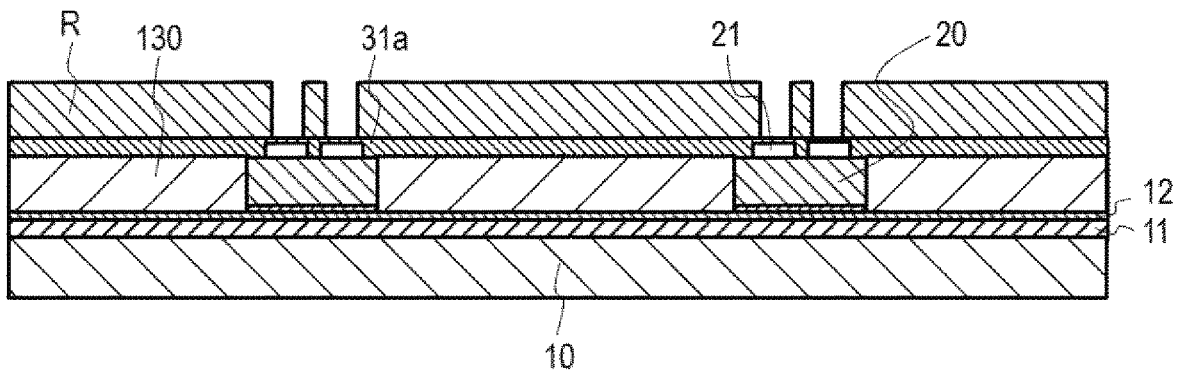

Continuing as shown in FIG. 7, a resist R is provided on the first metal layer 31a. The resist R is formed to have an opening including at least a portion of the element electrodes 21 when viewed in plan. It is preferable for the opening of the resist R to be positioned inward of the exterior form of the light-emitting element 20 when viewed in plan.

Figure 8:
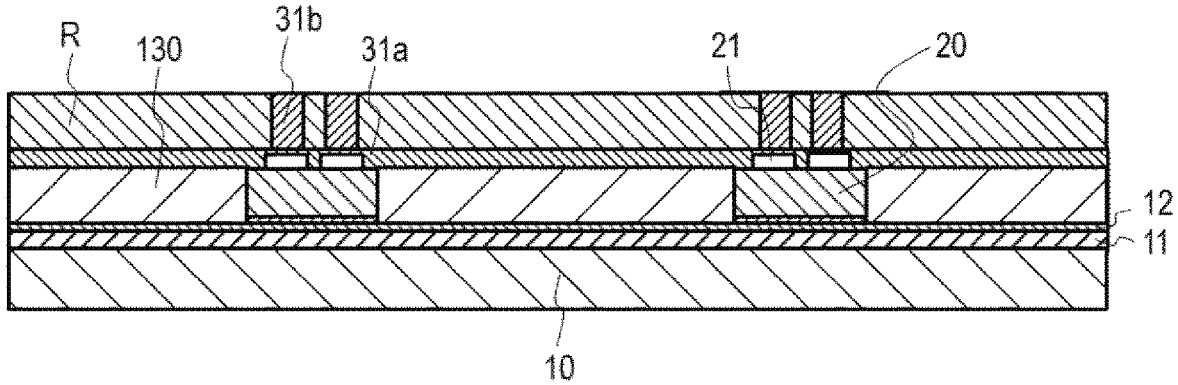

Then, as shown in FIG. 8, the second metal layer 31b is formed in the opening of the resist R by electroplating. The second metal layer 31b is deposited by plating in the opening of the resist by using the first metal layer 31a as the seed layer, i.e., the current path, of electroplating. For example, Cu is an example of the second metal layer 31b.

Figure 9:
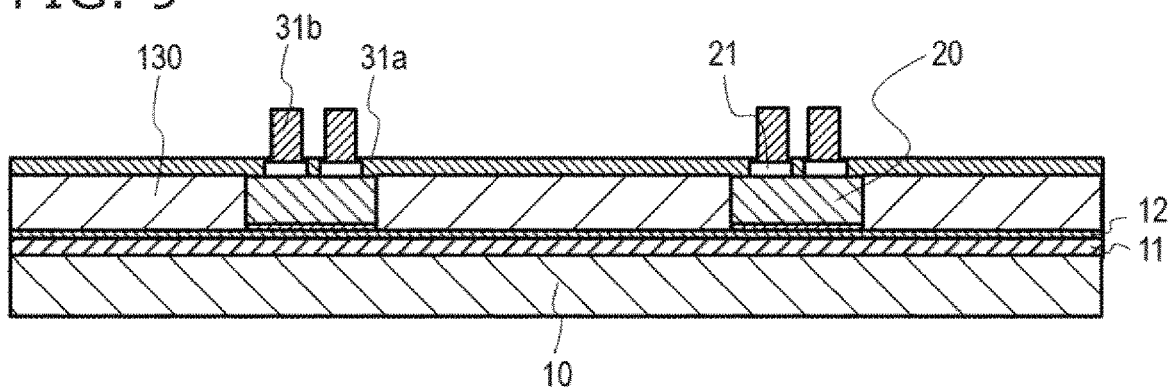

Then, as shown in FIG. 9, the resist is removed; and the second metal layer 31b is exposed.

Figure 10A:
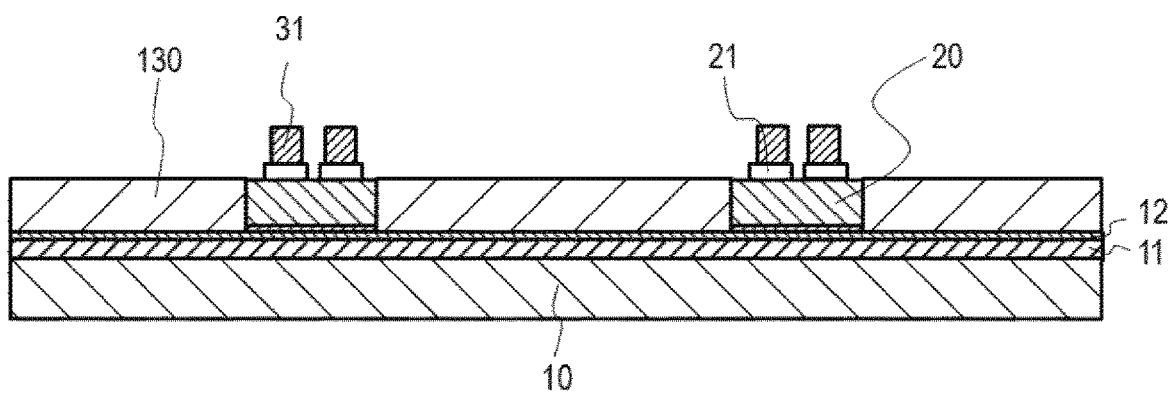

Continuing as shown in FIG. 10A, the first metal layer 31a that is in the region where the second metal layer 31b is not formed is removed by etching. Thereby, the first conductive member 31 in which the first metal layer 31a and the second metal layer 31b are stacked is formed only above the light-emitting element 20. Thereby, it can be ensured that the thickness of the first light-reflective resin layer formed around the light-emitting element 20 in a process of forming the first light-reflective resin layer described below is greater than the thickness of the light-emitting element 20.

Figure 10B:
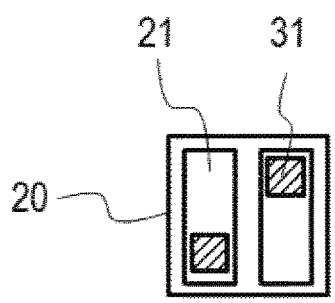
FIG. 10B is a schematic plan view of an example of a light-emitting element and a first conductive member in a manufacturing process of the light-emitting module according to the embodiment.

It is preferable for the pair of first conductive members 31 formed on the element electrodes 21 of each light-emitting element 20 to be provided at a wider spacing than the pair of element electrodes. Thereby, it can be ensured that the spacing of the pair of second conductive members is sufficient in a process of forming the second conductive members described below; therefore, shorts, etc., can be suppressed. When the light-emitting element is quadrilateral in a top view as shown in FIG. 10B, it is preferable for the pair of first conductive members 31 to be positioned at opposite corners on the light-emitting element. Thereby, even for a small light-emitting element, the spacing of the pair of first conductive members 31 can be large; therefore, it can be ensured that the spacing of the pair of second conductive members formed on the pair of first conductive members 31 also is sufficient.

The first conductive members 31 are formed on the element electrodes 21 of the light-emitting element 20;

therefore, the positions where the first conductive members 31 are provided with respect to the positions of the element electrodes 21 of the light-emitting element 20 can be adjusted even when misalignment of the light-emitting element 20 occurs in the process of placing the light-emitting element 20. Thereby, compared to the case where the light-emitting element is placed on the first conductive members formed on a substrate, connection defects due to the misalignment of the first conductive members 31 and the element electrodes 21 of the light-emitting element 20 can be suppressed.

Figure 11:
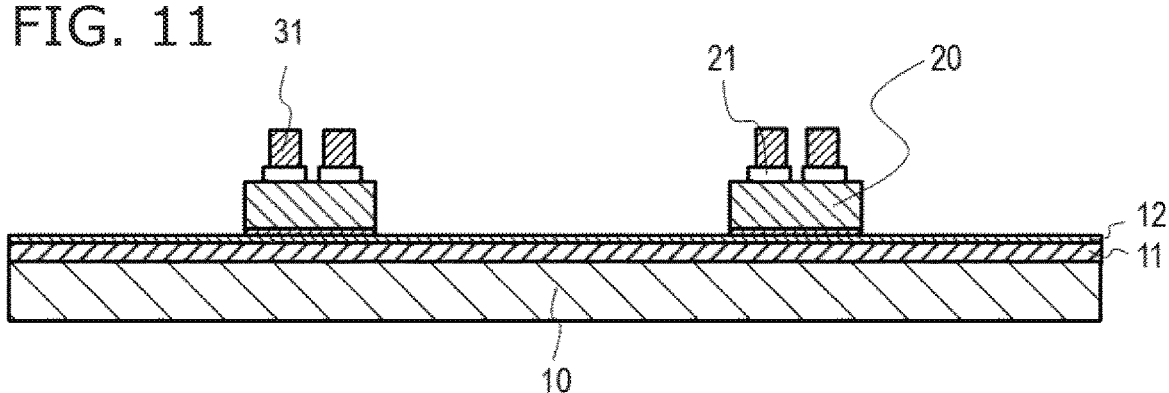
FIG. 11 to FIG. 25 are schematic cross-sectional views showing a manufacturing process of the light-emitting module according to the embodiment.

Continuing as shown in FIG. 11, the side surface of the light-emitting element 20 is exposed by removing the covering layer 130 by etching.

Process of Forming First Light-Reflective Resin Layer 51

Figure 12:
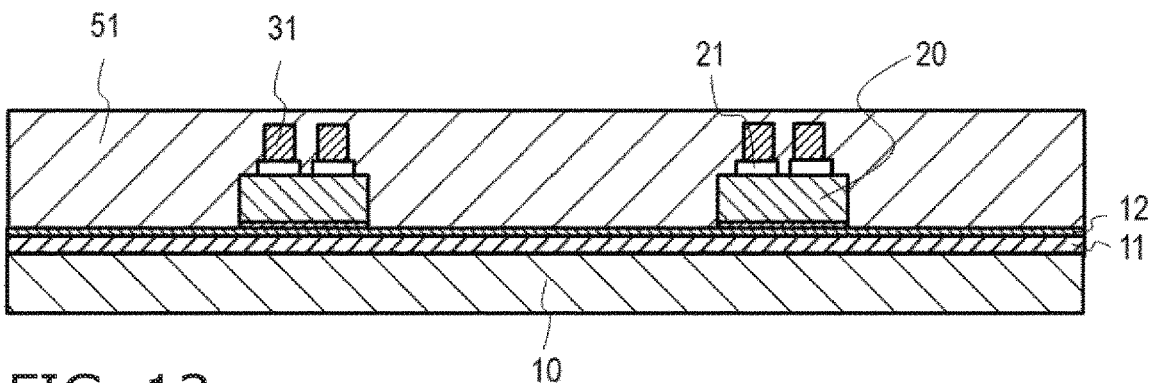

Then, as shown in FIG. 12, the first light-reflective resin layer 51 is formed on the support member 10. For example, a mixture of titanium oxide and a silicone resin can be used as the first light-reflective resin layer 51. For example, the first light-reflective resin layer 51 is formed to have a thickness that buries the light-emitting element 20 and the first conductive members 31 by using a method such as transfer molding, compression molding, potting, printing, spraying, etc.

Figure 13:
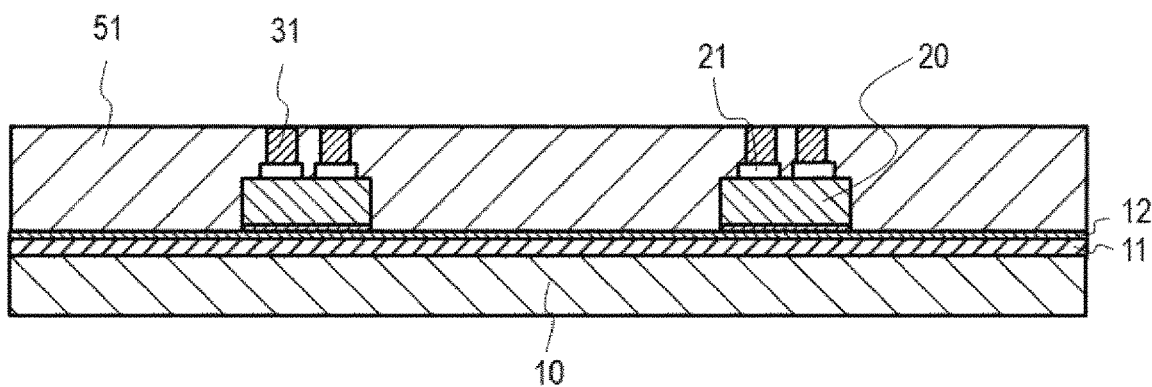

As shown in FIG. 13, the first conductive members 31 are exposed at the surface by polishing the surface of the first light-reflective resin layer 51. Thereby, the first light-reflective resin layer 51 is formed on the support member 10 and around the light-emitting element 20 and the first conductive members 31.

Process of Forming Second Conductive Member 32

Then, the pair of second conductive members 32 is formed on the first light-reflective resin layer 51 and respectively on the first conductive members 31 so that the second conductive member 32 is wider than the first conductive member 31. The second conductive member 32 is formed by stacking a third metal layer 32a and a fourth metal layer 32b.

Figure 14:
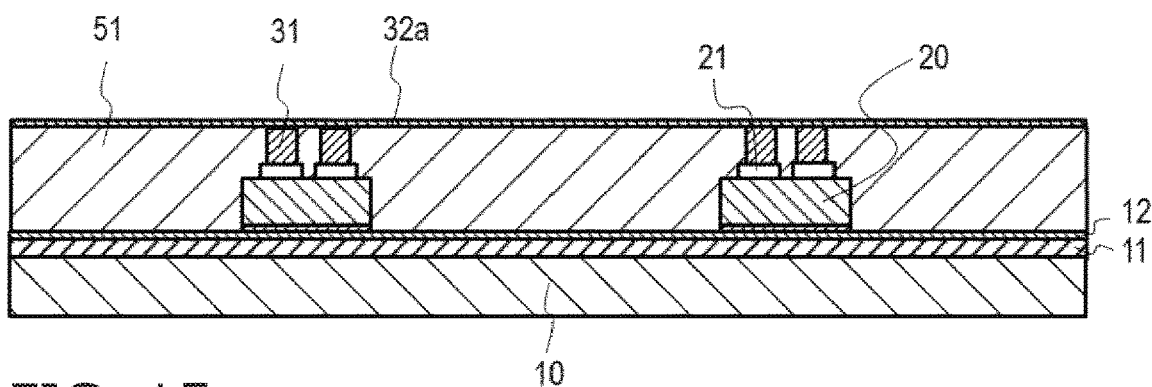

In the process of forming the second conductive member 32, first, the third metal layer 32a is formed on the first conductive member 31. In FIG. 14, the third metal layer 32a is formed on substantially the entire surface of the first conductive members 31 and the first light-reflective resin layer 51 by sputtering, etc. The third metal layer 32a is used as a seed layer when forming the fourth metal layer 32b by electroplating in a process of forming the fourth metal layer 32b which is a subsequent process. A material similar to that of the first metal layer 31a can be used as the stacked structure of the third metal layer 32a; for example, Al/Ti/Cu or the like from the support member 10 side is an example.

Figure 15:
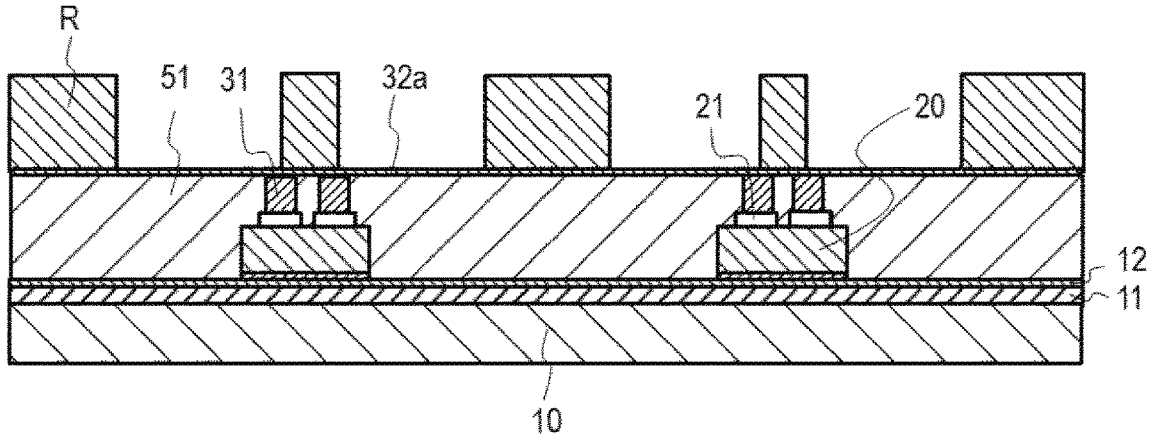

Then, as shown in FIG. 15, the resist R is provided on the third metal layer 32a. The resist R is formed to have an opening including at least a portion of the first conductive members 31 when viewed in plan.

Figure 16:
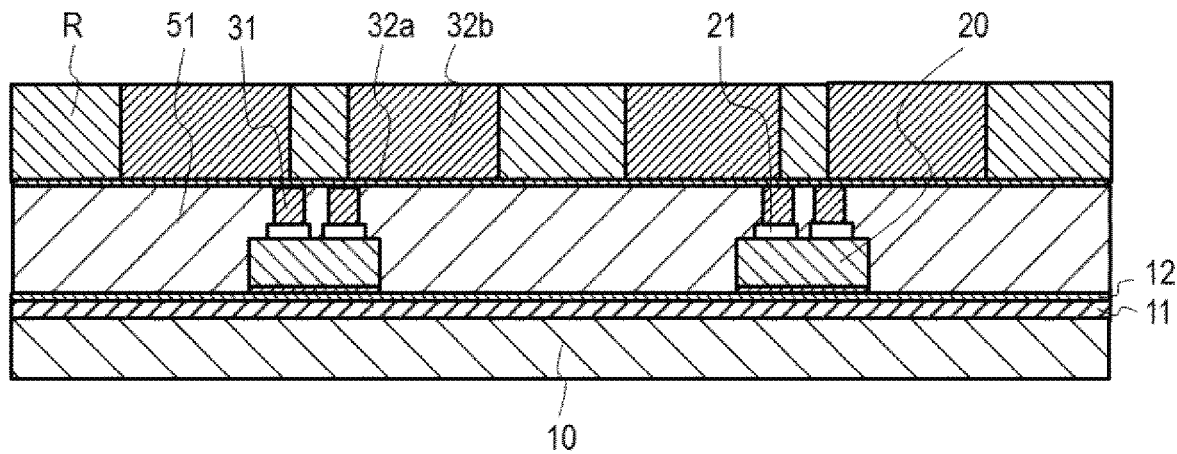

Continuing as shown in FIG. 16, the fourth metal layer 32b is formed in the opening of the resist R by electroplating. The fourth metal layer 32b is deposited by plating in the opening of the resist by using the third metal layer 32a as the seed layer, i.e., the current path, of electroplating. A material similar to that of the second metal layer 31b can be used as the fourth metal layer 32b; for example, Cu is an example.

Figure 17:
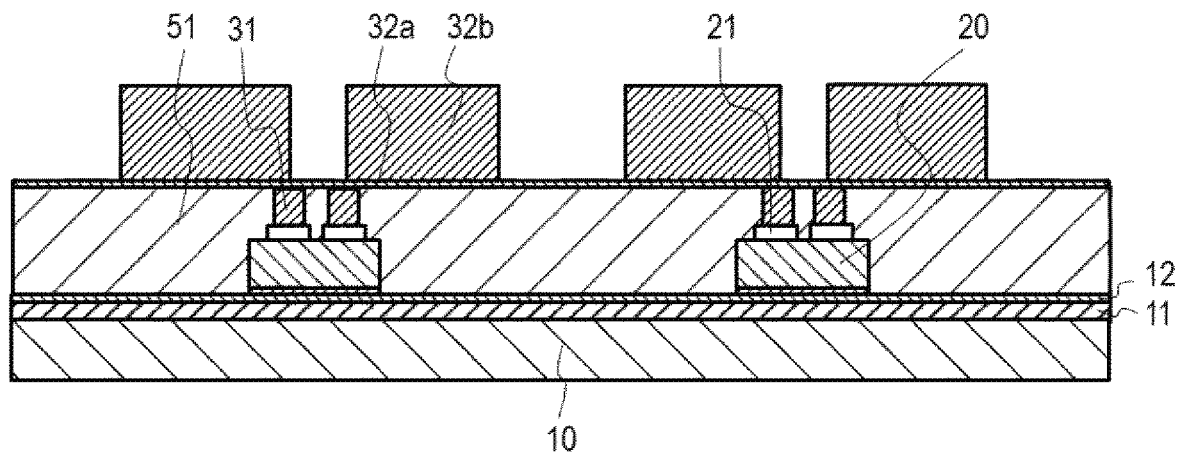
Figure 18:
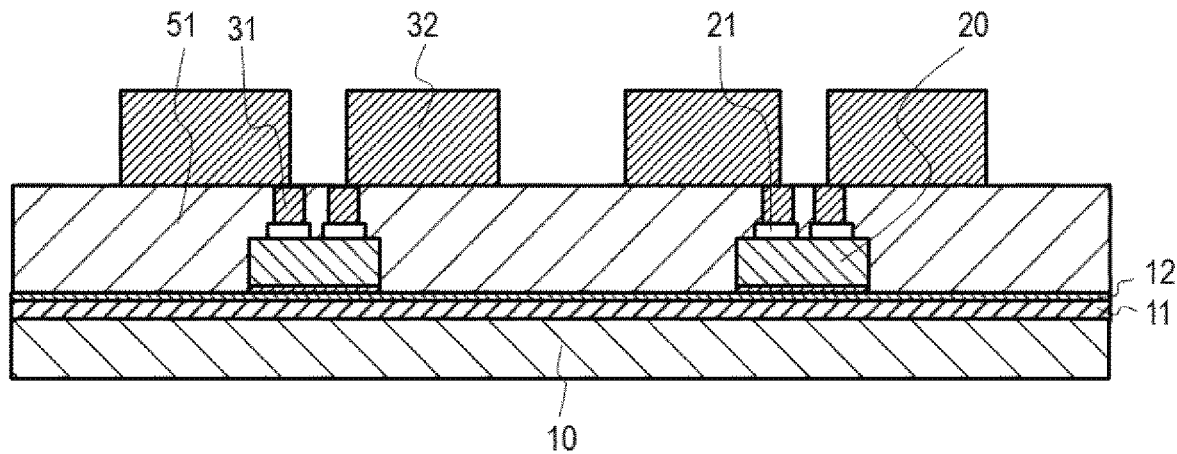

Then, as shown in FIG. 17, the resist is removed; and the fourth metal layer 32b is exposed. The third metal layer 32a that is in the region where the fourth metal layer 32b is not formed is removed by etching. Thereby, the second conductive member 32 in which the third metal layer 32a and the fourth metal layer 32b are stacked is formed over the first light-reflective resin layer 51 from the first conductive member 31 as shown in FIG. 18. Thus, by setting the second conductive member 32 to be wide, the second conductive member 32 can be formed stably to have the desired thickness. Also, the wiring electrode can be formed easily for the second conductive member 32 in the process of forming the wiring electrode described below.

Process of Forming Second Light-Reflective Resin Layer 52

Figure 19:
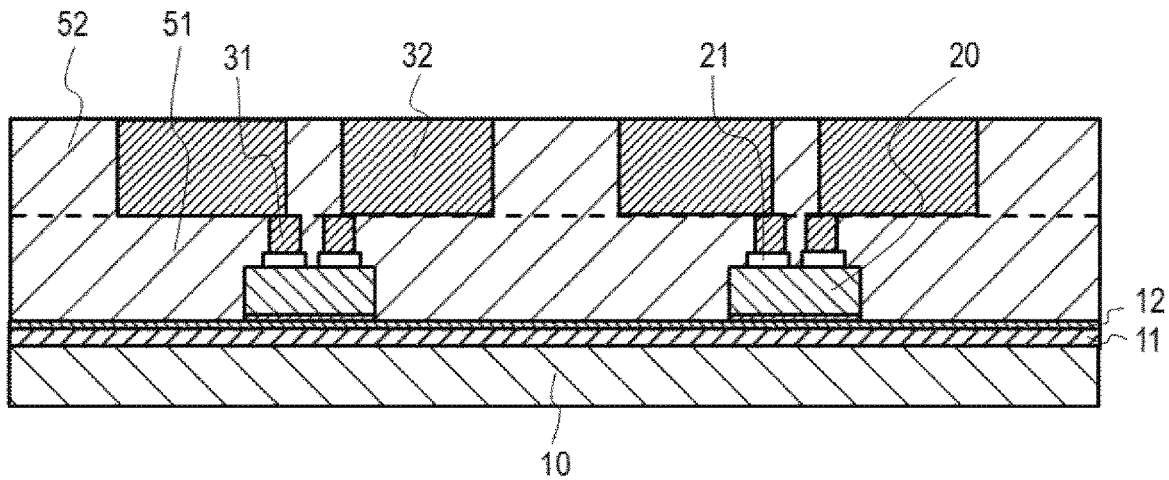

Continuing as shown in FIG. 19, the second light-reflective resin layer 52 is formed on the first light-reflective resin layer 51. For example, a mixture of titanium oxide and a silicone resin can be used as the second light-reflective resin layer 52. Similarly to the first light-reflective resin layer 51, for example, the second light-reflective resin layer 52 is formed to have a thickness that buries the light-emitting element 20 and the first conductive members 31 by using a method such as transfer molding, compression molding, potting, printing, spraying, etc. Subsequently, the second conductive members 32 are exposed at the surface by polishing the surface of the second light-reflective resin layer 52.

Process of Forming Wiring Electrode 40

Then, the wiring electrode 40 is formed on the second light-reflective resin layer 52 and respectively on the second conductive members 32. The wiring electrode 40 is formed by stacking a fifth metal layer 40a and a sixth metal layer 40b.

Figure 20:
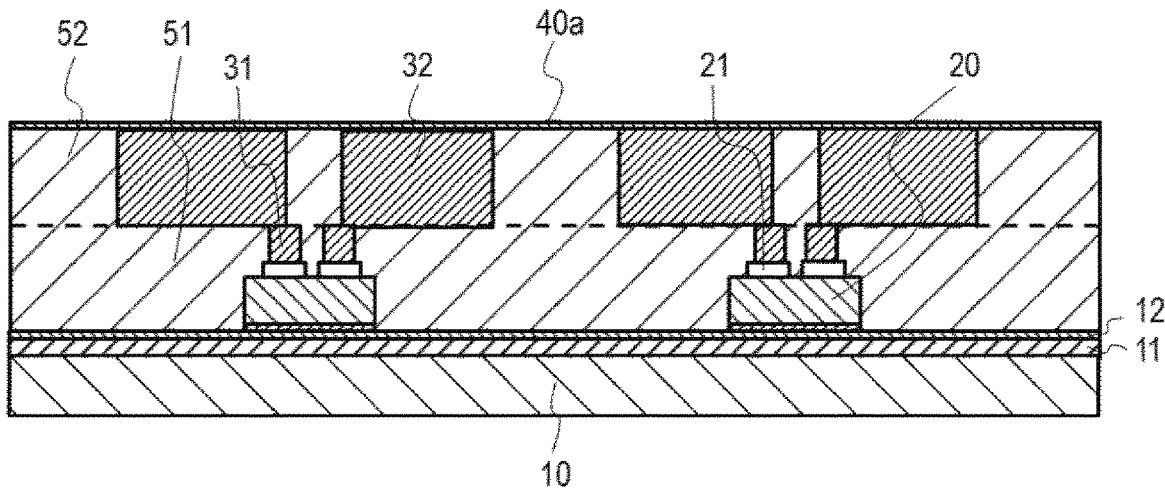

In the process of forming the wiring electrode 40, first, the fifth metal layer 40a is formed on the second conductive member 32. In FIG. 20, the fifth metal layer 40a is formed on substantially the entire surface of the second conductive member 32 and the second light-reflective resin layer 52 by sputtering, etc. The fifth metal layer 40a is used as a seed layer when forming the sixth metal layer 40b by electroplating in a process of forming the sixth metal layer 40b which is a subsequent process. For example, Ti/Cu from the support member 10 side can be used as the material of the fifth metal layer 40a. The fifth metal layer 40a may include a material and a stacked structure similar to those of the first metal layer 31a.

Figure 21:
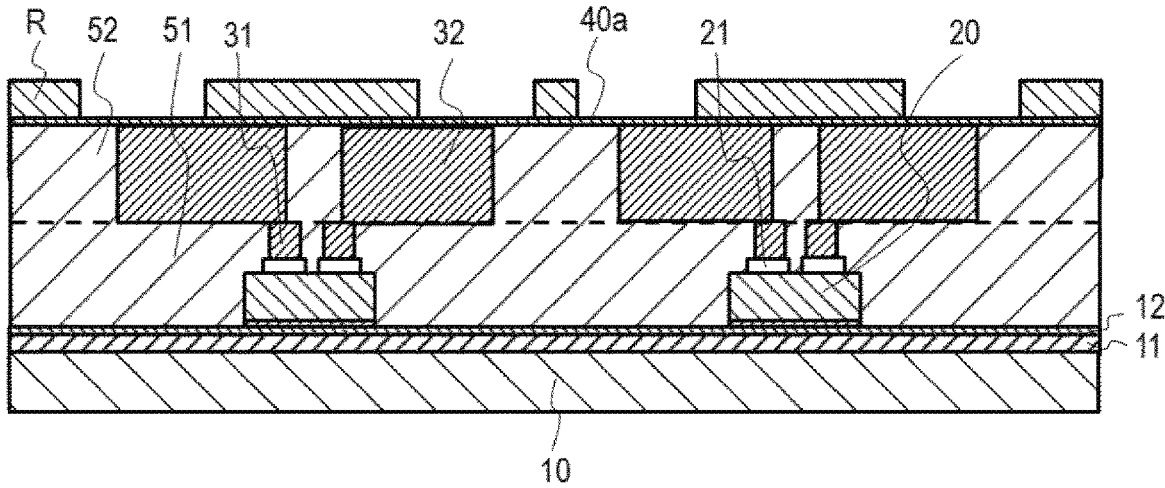

Continuing as shown in FIG. 21, the resist R is provided on the fifth metal layer 40a. The resist R is formed to have an opening including at least a portion of the second conductive members 32 when viewed in plan.

Figure 22:
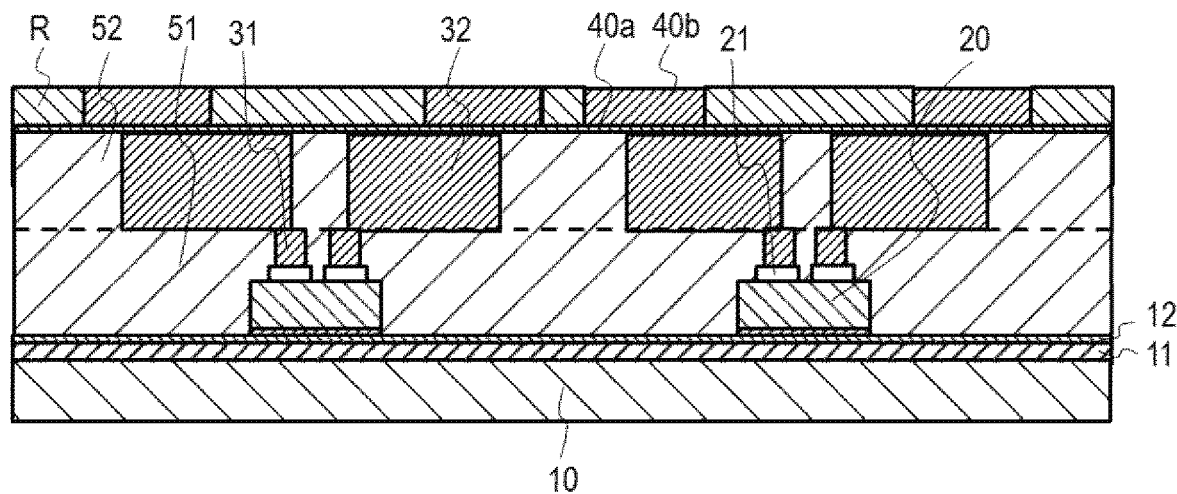

Then, as shown in FIG. 22, the sixth metal layer 40b is formed in the opening of the resist R by electroplating. The sixth metal layer 40b is deposited by plating in the opening of the resist by using the fifth metal layer 40a as the seed layer, i.e., the current path, of electroplating. A material similar to that of the second metal layer 31b can be used as the sixth metal layer 40b; for example, Cu is an example.

Figure 23:
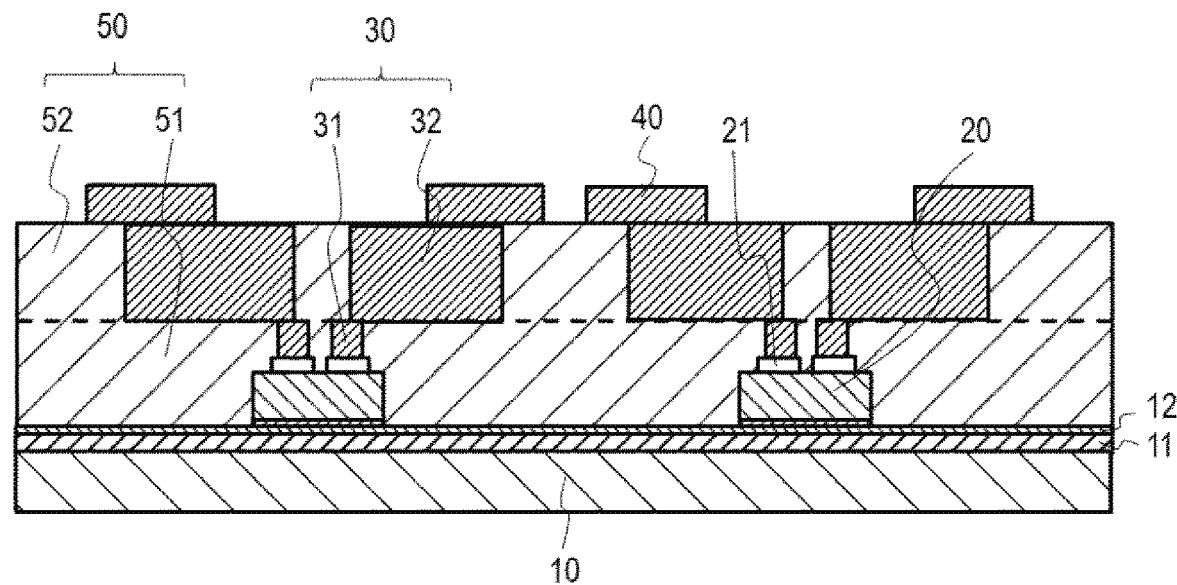

Then, the sixth metal layer 40b is exposed by removing the resist. The fifth metal layer 40a that is in the region where the sixth metal layer 40b is not formed is removed by etching. Thereby, as shown in FIG. 23, the wiring electrode 40 in which the fifth metal layer 40a and the sixth metal layer 40b are stacked is formed over the second light-reflective resin layer 52 from the second conductive members 32.

Process of Bonding Substrate 60

Figure 24:
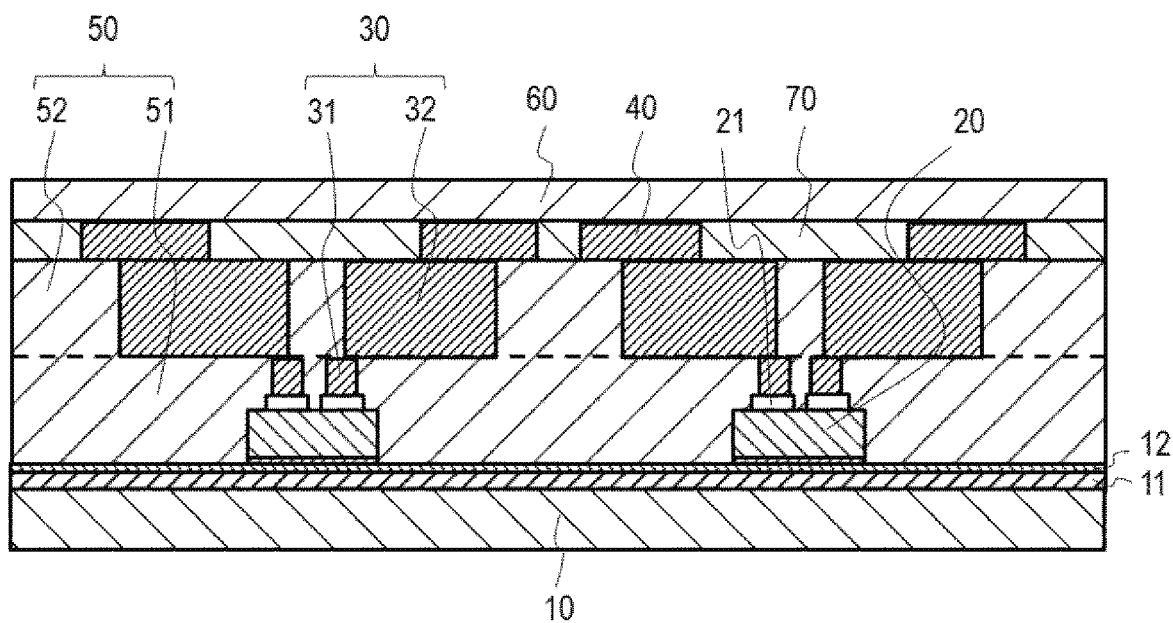

After the process of forming the wiring electrode 40, a process of bonding a separately-prepared substrate 60 on the light-reflective resin layer 50 may be performed as shown in FIG. 24. The substrate 60 is bonded via a bonding agent 70. The substrate 60 may include glass a ceramic, etc.

Process of Removing Support Member 10

Figure 25:
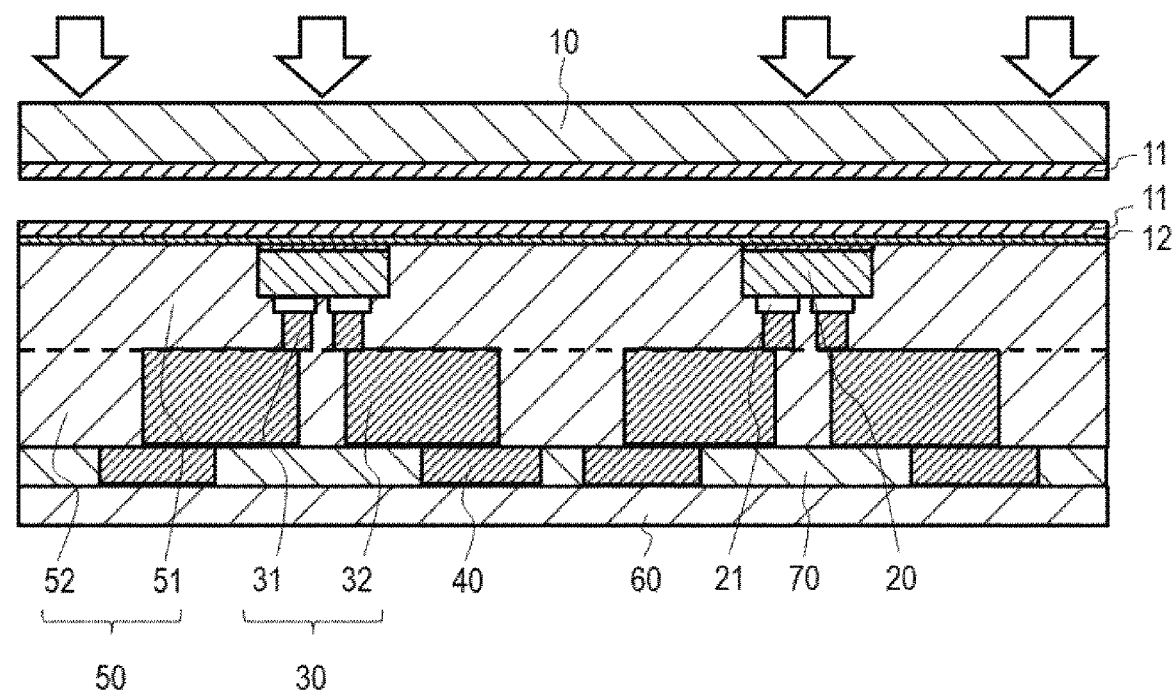

Then, as shown in FIG. 25, the support member is removed by laser lift-off. Specifically, the light-emitting element 20 and the support member 10 are separated by irradiating a laser of a wavelength passing through the support member onto the release layer 11 from the support member side.

Continuing, the light-emitting element 20 and the first light-reflective resin layer 51 are exposed by removing the release layer 11, the protective layer 12, and the bonding layer 13 by using dry etching, etc.

Thus, the light-emitting module 100 which has the structure shown in FIG. 1 can be obtained.

The components of the light-emitting module will now be described.

Substrate 60

As long as the light-reflective resin layer 50 can be formed on the upper surface of the substrate 60, the configuration of the substrate 60 is not particularly limited; but it is preferable for the upper surface of the substrate 60 to be flat. The substrate 60 may be insulative; for example, it is preferable to use glass, a ceramic, etc. Also, the substrate 60 may be flexible.

First Light-Reflective Resin Layer 51 and Second Light-Reflective Resin Layer 52

The first light-reflective resin layer 51 and the second light-reflective resin layer 52 cover the electrode formation surface 20a and the side surface of the light-emitting element 20. By providing the first light-reflective resin layer 51 and the second light-reflective resin layer 52, the light that is emitted from the electrode formation surface 20a and the side surface of the light-emitting element 20 can be reflected toward the light extraction surface side.

The reflectances of the first light-reflective resin layer 51 and the second light-reflective resin layer 52 are not less than 60% for the light emitted from the light-emitting element 20, and preferable 90% or more. It is preferable for the first light-reflective resin layer 51 and the second light-reflective resin layer 52 to be resins including a white pigment, etc. In particular, it is preferable to use a silicone resin including titanium oxide. Thereby, the light-emitting module can be inexpensive because an inexpensive raw material such as titanium oxide is used in a relatively large amount to cover the surfaces of the substrate 60.

First Conductive Member 31, Second Conductive Member 32, and Wiring Electrode 40

The first conductive members 31, the second conductive members 32, and the wiring electrodes 40 are electrically connected to the element electrodes 21 of the light-emitting element 20. By providing the first conductive members 31, the second conductive members 32, and the wiring electrodes 40, for example, the multiple light-emitting elements 20 can be electrically connected to each other; and a circuit necessary for local dimming or the like can be formed easily.

It is preferable to use a material having a low electrical resistance as the materials of the first conductive member 31, the second conductive member 32, and the wiring electrode 40; for example, at least one selected from the group consisting of Cu, Au, and Al is included. Among these elements, it is preferable to use Cu. It is preferable for the surface of the first conductive member 31 at the substrate side to include a material having a high reflectance to the light from the light-emitting element 20; for example, at least one selected from the group consisting of Al, Ag, Pt, and Rh is included. Among these elements, Al, Ag, or an alloy including these metals having a high reflectance to the light from the light-emitting element 20 are preferable. In particular, Al is preferable because not only the reflectivity to the light from the light-emitting element 20 but also the conductivity which is necessary as an interconnect circuit is excellent.

Although the thickness of the first conductive member 31 is not particularly limited, it is preferable for the thickness to be such that the process of exposing the first conductive member 31 at the surface can be performed by polishing the surface of the first light-reflective resin layer 51 described above. The thickness of the first conductive member 31 is, for example, about 10 μm to 20 μm. It is preferable for the second conductive member 32 to be thicker than the first conductive member. Although the thickness of the second conductive member 32 is not particularly limited, the thickness of the second conductive member 32 is, for example, about 10 μm to 100 μm. Although the thickness of the wiring electrode 40 is not particularly limited, the thickness of the wiring electrode 40 is, for example, about 0.1 μm to 5 μm.

Light-Emitting Element 20

A pair of electrodes is provided at the same surface side of the light-emitting element 20. A known semiconductor light-emitting element including a nitride semiconductor or the like is applicable to the light-emitting element 20. Also, any wavelength of the light-emitting element 20 can be selected to obtain the desired light emission color.

Light-emitting diodes of various light emission wavelengths can be utilized as the light-emitting elements 20. A fluorescer described below may be used in combination to obtain the desired light emission color. In particular, to obtain a white light emission, it is preferable to combine a nitride semiconductor light-emitting element emitting blue light with a fluorescer absorbing blue light and emitting yellow light, green light, and/or red light.

Figure 26:
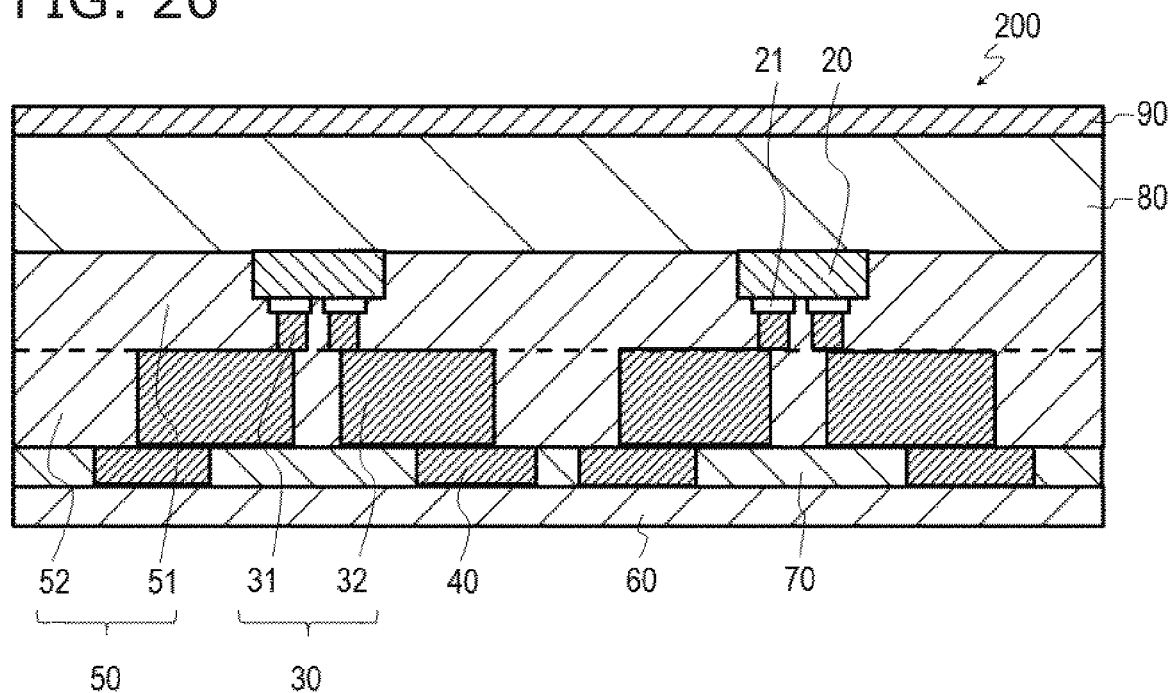
FIG. 26 is a schematic cross-sectional view of a light-emitting module according to another embodiment of the present disclosure.

As shown in FIG. 26, a transparent member 80 and a wavelength conversion member 90 may be further provided above the light-emitting element 20.

Transparent Member 80

It is preferable for the transparent member 80 to be provided between the light-emitting element 20 and the wavelength conversion member 90 described below. Thereby, the light that is emitted from the light-emitting element 20 can enter the wavelength conversion member 90 efficiently. A transparent resin, glass, etc., can be used as the transparent member 80. From the perspective of durability, ease of molding, etc., it is preferable to use a silicone resin or the like as the transparent resin.

Wavelength Conversion Member 90

It is preferable for the wavelength conversion member 90 to be provided at the upper surface of the transparent member 80. The wavelength conversion member 90 includes a fluorescer that can absorb the light from the light-emitting element 20 and emit light of another wavelength. Thereby, a light-emitting module 200 can externally emit mixed light, e.g., white light, of the light from the light-emitting element 20 and the light undergoing wavelength conversion in the wavelength conversion member 90. The color of the emitted light can be adjusted as appropriate by selecting the type of the light-emitting element 20 and the type of the fluorescer.

In the light-emitting module 200 as shown in FIG. 26, one transparent member 80 and one wavelength conversion member 90 may be provided for the multiple light-emitting elements 20. Thereby, the light-emitting module 100 can be configured to have a planar light emission having a large surface area. The transparent member 80 and the wavelength conversion member 90 may be provided for each light-emitting element 20.

Figure 27:
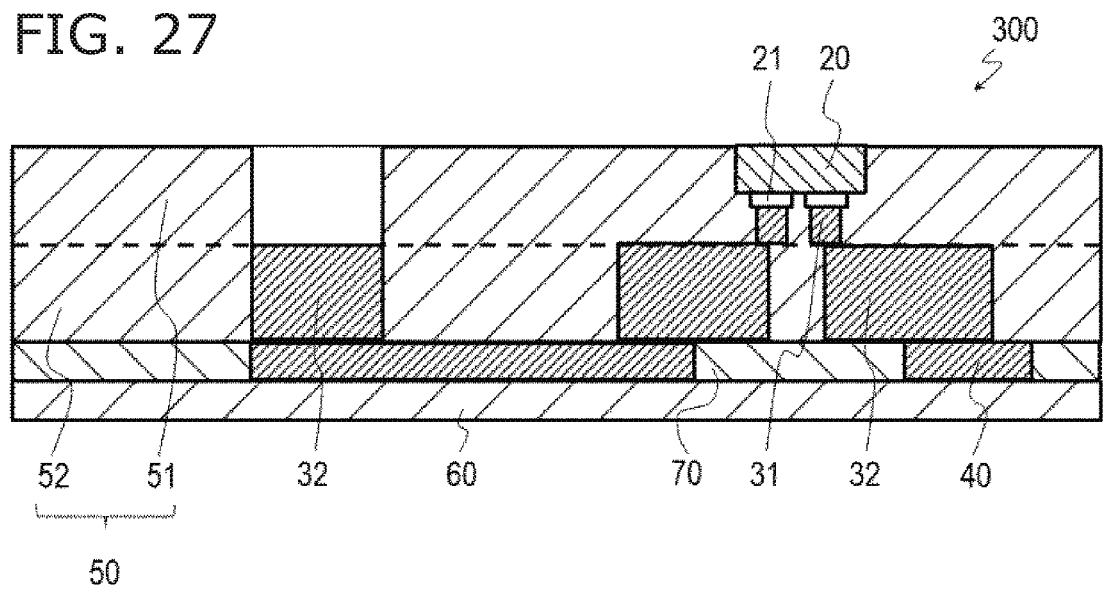
FIG. 27 is a schematic cross-sectional view of a light-emitting module according to yet another embodiment of the present disclosure.

As in a light-emitting module 300 as shown in FIG. 27, a power supply portion may be formed at the upper surface side of the light-emitting module 100 by forming the second conductive member 32 in a region separated from the light-emitting element 20 and by connecting the second conductive member 32 and the wiring electrode 40.

What is claimed is:

1. A method for manufacturing a light-emitting module, comprising:
    placing a light-emitting element on a support member with an electrode formation surface of the light-emitting element facing upward, the electrode formation surface including a pair of positive and negative element electrodes at a same surface side, the light-emitting element having the electrode formation surface and a light-emitting surface at a side opposite to the electrode formation surface;
    forming a pair of first conductive members respectively on the element electrodes;
    forming a first light-reflective resin layer on the support member and around the light-emitting element and the first conductive members;
    forming a pair of second conductive members on the first light-reflective resin layer and respectively on the first conductive members, the second conductive member being wider than the first conductive member;
    forming a second light-reflective resin layer on the first light-reflective resin layer and around the second conductive members;
    forming wiring electrodes over the second light-reflective resin layer from the second conductive members;
    bonding a substrate on the second light-reflective resin layer; and
    removing the support member after bonding the substrate on the second light-reflective resin layer.

2. The method according to claim 1, wherein the pair of first conductive members is provided at a wider spacing than the pair of element electrodes.

3. The method according to claim 1, wherein
    forming the pair of first conductive members includes:
        forming a covering layer on the support member and around the light-emitting element;
        forming the pair of first conductive members on the element electrodes and the covering layer; and
        removing the covering layer.

4. The method according to claim 2, wherein
    forming the pair of first conductive members includes:
        forming a covering layer on the support member and around the light-emitting element;
        forming the pair of first conductive members on the element electrodes and the covering layer; and
        removing the covering layer.

5. The method according to claim 1, wherein forming the pair of second conductive members includes forming the pair of second conductive members to cause proximal end portions of the pair of second conductive members to be positioned on the first conductive members in a top view.

6. The method according to claim 2, wherein forming the pair of second conductive members includes forming the pair of second conductive members to cause proximal end portions of the pair of second conductive members to be positioned on the first conductive members in a top view.

7. The method according to claim 3, wherein forming the pair of second conductive members includes forming the pair of second conductive members to cause proximal end portions of the pair of second conductive members to be positioned on the first conductive members in a top view.

8. The method according to claim 1, wherein
    the light-emitting element is quadrilateral in a top view, and
    forming the pair of first conductive members includes forming the pair of first conductive members to be positioned at opposite corners on the light-emitting element.

9. The method according to claim 2, wherein
    the light-emitting element is quadrilateral in a top view, and
    forming the pair of first conductive members includes forming the pair of first conductive members to be positioned at opposite corners on the light-emitting element.

10. The method according to claim 3, wherein
    the light-emitting element is quadrilateral in a top view, and
    forming the pair of first conductive members includes forming the pair of first conductive members to be positioned at opposite corners on the light-emitting element.

11. The method according to claim 5, wherein
    the light-emitting element is quadrilateral in the top view, and
    forming the pair of first conductive members includes forming the pair of first conductive members to be positioned at opposite corners on the light-emitting element.

12. The method according to claim 1, wherein
    placing the light-emitting element includes placing a plurality of the light-emitting elements on the support member at a prescribed spacing, and
    forming the wiring electrodes includes forming the wiring electrodes to connect the element electrodes of the plurality of light-emitting elements to each other.

13. The method according to claim 2, wherein
    placing the light-emitting element includes placing a plurality of the light-emitting elements on the support member at a prescribed spacing, and
    forming the wiring electrodes includes forming the wiring electrodes to connect the element electrodes of the plurality of light-emitting elements to each other.

14. The method according to claim 3, wherein
    placing the light-emitting element includes placing a plurality of the light-emitting elements on the support member at a prescribed spacing, and
    forming the wiring electrodes includes forming the wiring electrodes to connect the element electrodes of the plurality of light-emitting elements to each other.

15. The method according to claim 5, wherein
    placing the light-emitting element includes placing a plurality of the light-emitting elements on the support member at a prescribed spacing, and
    forming the wiring electrodes includes forming the wiring electrodes to connect the element electrodes of the plurality of light-emitting elements to each other.

16. The method according to claim 8, wherein
    placing the light-emitting element includes placing a plurality of the light-emitting elements on the support member at a prescribed spacing, and
    forming the wiring electrodes includes forming the wiring electrodes to connect the element electrodes of the plurality of light-emitting elements to each other.

17. The method according to claim 1, wherein in the placing the light-emitting element on the support member, the light-emitting element is bonded on the support member by a bonding layer.

18. The method according to claim 2, wherein the pair of second conductive members is provided at a wider spacing than the pair of first conductive members.

\* \* \* \* \*